(12) United States Patent
Fischer et al.

(10) Patent No.: US 12,166,148 B2
(45) Date of Patent: Dec. 10, 2024

(54) REPAIR METHOD FOR SEALING THE BACK OF PHOTOVOLTAIC MODULES

(71) Applicants: Horst Fischer, Winnenden (DE); Josef Joachim Gmeiner, Pressath (DE)

(72) Inventors: Horst Fischer, Winnenden (DE); Peter John, Lichtenberg (DE)

(73) Assignees: Horst Fischer, Winnenden (DE); Josef Joachim Gmeiner, Pressath (DE)

( * ) Notice: Subject to any disclaimer, the term of this patent is extended or adjusted under 35 U.S.C. 154(b) by 144 days.

(21) Appl. No.: 17/957,187

(22) Filed: Sep. 30, 2022

(65) Prior Publication Data
US 2024/0113249 A1    Apr. 4, 2024

(51) Int. Cl.
*H01L 31/18* (2006.01)
*H02S 50/10* (2014.01)
*H02S 99/00* (2014.01)

(52) U.S. Cl.
CPC .......... *H01L 31/186* (2013.01); *H02S 50/10* (2014.12); *H02S 99/00* (2013.01)

(58) Field of Classification Search
None
See application file for complete search history.

(56) References Cited

U.S. PATENT DOCUMENTS 8,988,096 B1 * 3/2015 Naiknaware ............. G01J 1/42
324/761.01
9,735,730 B2 * 8/2017 Naiknaware ............. G01J 1/42

2003/0116185 A1 * 6/2003 Oswald ............... H01L 31/0463
136/251
2011/0303276 A1 * 12/2011 Fujii .................... C09D 123/22
524/401

FOREIGN PATENT DOCUMENTS

| CA | 3186432 A1 * | 2/2024 | |
| CA | 3178024 A1 * | 3/2024 | |
| DE | 102020002093 A1 * | 10/2021 | H02S 50/00 |
| JP | 2003060220 A * | 2/2003 | |

OTHER PUBLICATIONS

English Translation of JP 2003060220 A (Year: 2003).*
English Translation of DE 10-2020-002093 A1 (Year: 2021).*
English Translation of CA 3186432 A1 (Year: 2024).*
English Translation of CA 3178024 A1 (Year: 2024).*

* cited by examiner

*Primary Examiner* — Jermele M Hollington
(74) *Attorney, Agent, or Firm* — Laurence A. Greenberg; Werner H. Stemer; Ralph E. Locher

(57) ABSTRACT

A method for efficiently sealing the back of photovoltaic modules as part of a repair. The photovoltaic modules pass through several process stages one after another, beginning with a selection of repairable photovoltaic modules, their anonymization and cleaning, followed by further process stages. The further process steps include drying, coating, and treating the coating with pulsed infrared radiation. The process is completed with a check of the process and a functional test using a flash test. The process conditions and apparatus configurations in the process stages are described in detail.

1 Claim, 1 Drawing Sheet

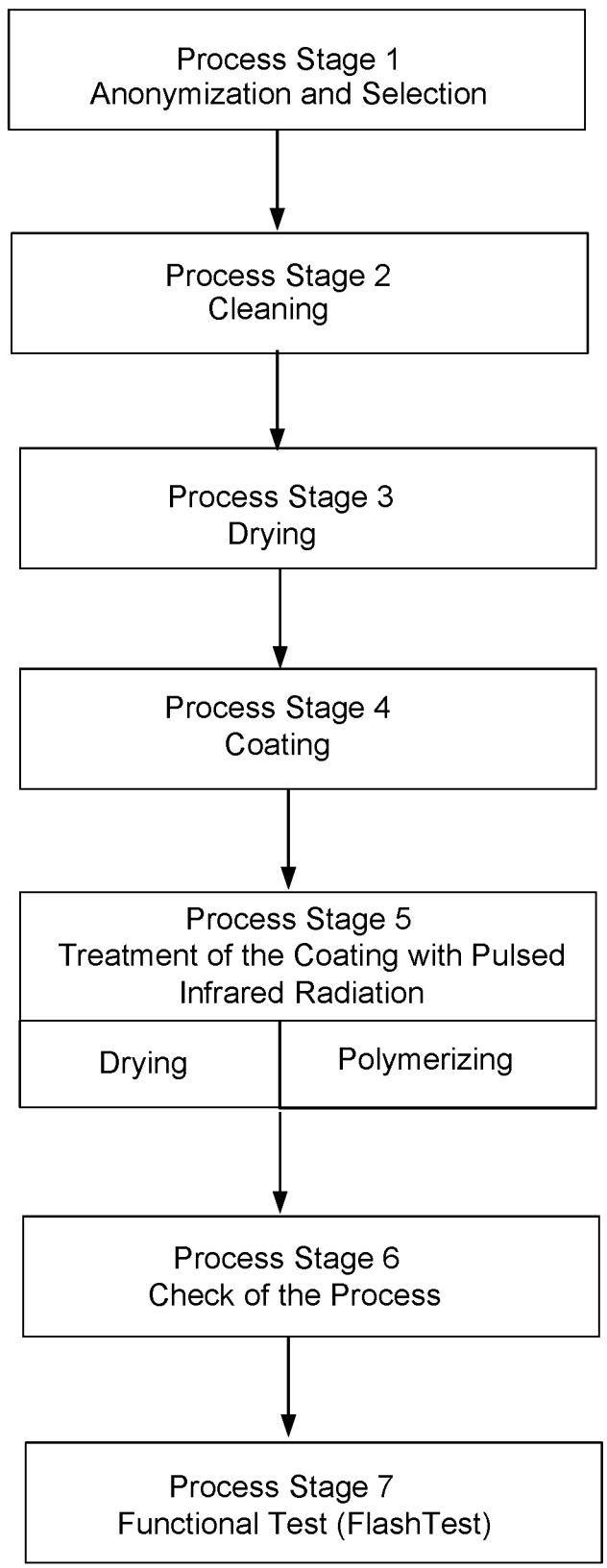

REPAIR METHOD FOR SEALING THE BACK OF PHOTOVOLTAIC MODULES

FIELD AND BACKGROUND OF THE INVENTION

The invention relates to a method for efficiently sealing the back of photovoltaic modules in the course of a repair.

Photovoltaic modules were and are coated on the back with various types of foil in one to three layers. Many millions of photovoltaic modules have been manufactured and installed in this way worldwide. The back foils used are made of polymer plastic which becomes porous after five to eight years and tends to tear or it may tear. This results in the failure of the entire module. Worn out photovoltaic panels must be discarded and replaced, with the possibility of repairing them for another use. So far, this has been done by glueing another foil on the back of the modules. However, this repair method works, if at all, only for a short time, because the back of the modules has become porous, like flour, over the years and is penetrated with water. The newly glued foil falls off after only a short time. The repair of photovoltaic modules according to this state of the art is therefore ineffective and impractical, especially with regard to the large number of photovoltaic modules to be repaired.

It would therefore be desirable to have a repair technology for photovoltaic modules available that is characterized with a high degree of automation. The repaired photovoltaic modules should be functional for at least ten years.

SUMMARY OF THE INVENTION

It is the object of the invention to provide a method for repairing photovoltaic modules. Since the type of damage predominantly affects the back of the photovoltaic modules, the method shall provide an efficient sealing of the back of a photovoltaic module as part of a repair technology.

With the above and other objects in view there is provided, in accordance with the invention, a method for back sealing photovoltaic modules, the method which comprises:
  executing a plurality of process stages in succession in a continuous process, starting with a process of selecting repairable photovoltaic modules, anonymizing and cleaning the photovoltaic modules, and ending with a process check and a functional test using a flash test. Details of the process stages and applicable process parameters are described and claimed below.

In other words, the objects of the invention are achieved by a holistic technology for the repair of photovoltaic modules as part of mass production and at the level of a very high efficiency of the overall process. The novel process enables in particular a drastic reduction in the crosslinking time of the high-quality sealing compound applied to the back of the modules from hitherto about 60 minutes, related to the production of the modules, to about three (3) minutes when repairing the same. This approximately 20-fold acceleration of the crosslinking time is associated with a noticeable reduction in energy consumption, with an above-average quality of the applied and polymerized plastic sealing.

In detail, the inventive method for back sealing of photovoltaic modules is characterized by the below indicated seven process stages, which the photovoltaic modules go through individually and continuously in <3 minutes.

Process Stage 1: Anonymization and Selection

All photovoltaic modules are marked and checked for suitability for repair. Based on previous experience, around 70 to 95% of the photovoltaic modules are suited for a repair.

Process Stage 2: Cleaning

All photovoltaic modules that are suitable for repair, as determined in process stage 1, are cleaned with a biodegradable cleaning agent.

A newly developed round brush with a splash guard is used for this purpose, which reaches all areas, especially the corners, of the back of the photovoltaic modules. The round brush is also used to clean the front of the photovoltaic modules. Thereafter, both the top oriented back as well as the downward-facing glass front of the photovoltaic modules are washed with osmotic-treated water. In this position, the photovoltaic modules are handed over to process stage 3.

Process Stage 3: Drying Off

The photovoltaic modules are first transferred to a roller conveyor, on which the drying of the photovoltaic modules is provided in three steps in a continuous run, namely
  wiping off the remaining water by rubber lips or squeegees,
  blowing off the still remaining water by an air curtain,
  removing the further still-remaining water on the back side of the photovoltaic modules facing upwards by drying same using pulsed infrared radiation at <80° C. within <2 minutes.

The emission of the pulsating infrared radiation is precisely aligned with the absorption of the water, resulting in a highly efficient energy transfer.

The process parameters are as follows:

| | |
|---|---|
| Throughput speed | 1-2.5 m/min |
| Height of pulsed IR module above the photovoltaic modules | 1-2.5 m/min |
| Pulsed infrared module length | 280-400 mm |
| Drying time | 1.5-4 min |
| Electrical power density | 6.3-16 kW/m2 |
| Pulsed infrared wavelength | 2.5-4 μm |
| Pulsed infrared emitter power | 1.6-3.2 cm2 |
| Pulsed infrared - emitter pulse power | 250-320 W/cm2 |
| Pulsed infrared - pulse duration | 10-16 μs |
| Pulsed infrared - pulse frequency | 40-100 kHz |

Drying is supported by a moderate laminar air flow of 0.1-0.5 m/min with 0.1-0.25 m³/h.

Process Stage 4: Coating

The clean and dry back surfaces of the photovoltaic modules are coated evenly with a liquid plastic sealing compound (adhesive or polymers) using spray nozzles. The sprayability of the sealing compound is provided and guaranteed by adding 20 to 40% of a water-soluble, environmentally friendly thinner. The layer thickness of the applied coating in the moist phase is 40 to 100 μm.

Process Stage 5: Treating the Coating with Pulsed Infrared Radiation

The transfer of the photovoltaic modules to this process stage also takes place using a roller conveyor, whereby the pulsed infrared treatment is carried out in two stages, namely drying and polymerizing.

Both process stages run continuously at <80° C. within <2 minutes.

Drying:

The surfaces of the backs of the photovoltaic modules coated in process stage 4 are also dried with pulsed infrared radiation.

As a result, the water introduced from the thinner will be evaporated completely, and in an extremely short time.

The following process conditions are to be observed:

| | |
|---|---|
| Throughput speed | 1-2.5 m/min |
| Height of the pulsed infrared module above the photovoltaic modules | 1-2.5 m/min |
| Pulse infrared module length | 580-800 mm |
| Drying time | 1.5-4 min |
| Electrical power density | 6.3-16 kW/m2 |
| Pulsed infrared wavelength | 3.0-4.5 μm |
| Pulsed infrared emitter power | 1.6-3.2 cm2 |
| Pulsed infrared - emitter pulse power | 250-320 W/cm2 |
| Pulsed infrared - pulse duration | 12-25 μs |
| Pulsed infrared - pulse frequency | 40-100 kHz |

Here, too, drying is supported by a moderate laminar air flow of 0.1-0.5 m/min with 0.1-0.25 m³/h.

Polymerizing:

The polymer sealing compound, now without water, is in turn polymerized extremely quickly with pulsed infrared radiation in an above-average quality regarding adhesion, strength, toughness and durability into a sealed hermetically closed layer, actually under the following conditions:

| | |
|---|---|
| Throughput speed | 1-2.5 m/min |
| Pulse infrared module height above the photovoltaic modules | 1-2.5 m/min |
| Pulse infrared module length | 580-800 mm |
| Drying time | 1.5-4 min |
| Electrical power density | 6.3-16 kW/m2 |
| Pulsed infrared wavelength | 4.0-8.5 μm |
| Pulsed infrared emitter power | 1.6-3.2 cm2 |
| Pulsed infrared - emitter pulse power | 250-320 W/cm2 |
| Pulsed infrared - pulse duration | 3.2-15 μs |
| Pulsed infrared - pulse frequency | 40-100 kHz |

As in the prior steps, the polymerizing is supported by a moderate laminar air flow of 0.1-0.5 m/min with 0.1-0.25 m³/h.

Process Stage 6: Check of the Process

The entire process is checked using a camera system (Matrix Vision).

Process Stage 7: Functional Test (Flash Test)

The entire process is accompanied and documented by software. The photovoltaic modules are provided with a new identification.

Regarding the system, the process can advantageously be carried out in a standard container. Approximately 20 photovoltaic modules can be repaired in a continuous process per hour. The core of the innovation lies in the process stages 3, 4 and 5. These stages can also be used during the manufacturing of new photovoltaic modules.

Other features which are considered as characteristic for the invention are set forth in the appended claims.

Although the invention is illustrated and described herein as embodied in a repair method for sealing the back of photovoltaic modules, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE FIGURE

The sole FIGURE is a flowchart illustrating a sequence of the process steps 1 through 7 according to the invention.

DETAILED DESCRIPTION OF THE INVENTION

The method according to the invention for back-sealing of photovoltaic modules is in the following explained in more detail with reference to the drawing FIGURE.

The overall method consists of several process stages, which are run through by the photovoltaic modules to be repaired one after another.

In detail, these are the process stages:
anonymization and selection—1,
cleaning—2,
drying—3,
coating—4,
treatment of the coating with pulsed infrared radiation—5,
checking of the process—6,
functional test—7.

The process stages are described above and specific reference is had to the above information.

Systems according to the features of the invention are advantageously designed in such a way that the accommodation in a standard 40 foot high cube container, 40 ft (interior 39.475 ft, 12.032 m)×8 ft (int: 7.72 ft, 2.352 m)×9.5 ft (int: 8.85 ft, 2.698 m), is possible.

The foregoing specification is based on German published patent application DE 10 2020 002 093 A1, dated Oct. 7, 2021, which is herewith incorporated by reference. No claim is made to the priority of the German application. Any discrepancy, however, between the German published application and the instant specification should be resolved in favor of the former.

The invention claimed is:

1. A method for back sealing photovoltaic modules, the method which comprises:
   executing a plurality of process stages in succession in a continuous process, starting with a process of selecting repairable photovoltaic modules, anonymizing and cleaning the photovoltaic modules and ending with a process check and a functional test using a flash test;
   subsequent to the process stages anonymizing, selecting, and cleaning, executing a process stage drying with the following steps and features:
   drying the photovoltaic modules located on a roller conveyor, by
     wiping off remaining water;
     blowing off still remaining water using an air curtain;
     removing still further remaining water from upward facing backs of the photovoltaic modules by pulsed infrared radiation at <80° C. within <2 minutes, and thereby precisely adjusting an emission of the pulsating infrared radiation with an absorption of the water; and
   thereby complying with the following process parameters:

| | |
|---|---|
| throughput speed | 1-2.5 m/min |
| height of the pulsed infrared module above the photovoltaic modules | 1-2.5 m/min |
| pulse infrared module length | 280-400 mm |
| drying time | 1.5-4 min |

-continued

| | |
|---|---|
| electrical power density | 6.3-16 kW/m² |
| pulsed infrared wavelength | 2.5-4 μm |
| pulsed infrared emitter power | 1.6-3.2 cm² |
| pulse infrared emitter pulse power | 250-320 W/cm² |
| pulse infrared pulse duration | 10-16 μs |
| pulsed infrared pulse frequency | 40-100 kHz; | subsequently executing a downstream process stage coating by evenly coating the clean and dry back surfaces of the photovoltaic modules with a liquid plastic sealing compound using spray nozzles, thereby forming a coating with a layer thickness in a wet phase from 40 to 100 μm, and providing a sprayability of the sealing compound by adding of 20 to 40% of a water-soluble, environmentally friendly thinner;

in a following process stage treating the coating with pulsed infrared radiation, by irradiating the back surfaces of the photovoltaic modules with pulsed infrared radiation in two stages, being drying and polymerizing, in continuous operation at <80° C. within <2 minutes, to completely evaporate initially introduced water of the thinner and to form a waterless polymeric sealant, under the following process conditions:

| | |
|---|---|
| throughput speed | 1-2.5 m/min |
| pulse infrared module height above the photovoltaic modules | 1-2.5 m/min |
| pulse infrared module length | 580-800 mm |
| drying time | 1.5-4 min |
| electrical power density | 6.3-16 kW/m² |
| pulsed infrared wavelength | 3.0-4.5 μm |
| pulsed infrared emitter power | 1.6-3.2 cm2 |
| pulsed infrared - emitter pulse power | 250-320 W/cm2 |
| pulsed infrared - pulse duration | 12-25 μs |
| pulsed infrared - pulse frequency | 40-100 kHz; | subsequently polymerizing the waterless polymeric sealant by pulsed infrared radiation to form a closed layer under the following process conditions:

| | |
|---|---|
| throughput speed | 1-2.5 m/min |
| pulse infrared module height above the photovoltaic modules | 1-2.5 m/min |
| pulse infrared module length | 580-800 mm |
| drying time | 1.5-4 min |
| electrical power density | 6.3-16 kW/m2 |
| pulsed infrared wavelength | 4.0-8.5 μm |
| pulsed infrared emitter power | 1.6-3.2 cm2 |
| pulsed infrared - emitter pulse power | 250-320 W/cm2 |
| pulsed infrared - pulse duration | 3.2-15 μs |
| pulsed infrared - pulse frequency | 40-100 kHz | supporting the process stages drying and polymerizing by a moderate laminar air flow of 0.1-0.5 m/min with 0.1-0.25 m³/h; and finally executing process stages checking the process and functional testing using a flash test follow.

* * * * *